(12) United States Patent
Nishiyama et al.

(10) Patent No.: US 12,535,676 B2
(45) Date of Patent: *Jan. 27, 2026

(54) CLEANING DEVICE, IMAGING UNIT INCLUDING CLEANING DEVICE, AND CLEANING METHOD

(71) Applicant: Murata Manufacturing Co., Ltd., Nagaokakyo (JP)

(72) Inventors: Kenji Nishiyama, Nagaokakyo (JP); Takaaki Mori, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 322 days.

This patent is subject to a terminal disclaimer.

(21) Appl. No.: 18/134,073

(22) Filed: Apr. 13, 2023

(65) Prior Publication Data
US 2023/0258924 A1    Aug. 17, 2023

Related U.S. Application Data

(63) Continuation of application No. PCT/JP2021/038734, filed on Oct. 20, 2021.

(30) Foreign Application Priority Data

Oct. 23, 2020 (JP) ................ 2020-177862
Feb. 8, 2021 (JP) ................ 2021-018260

(51) Int. Cl.
*G02B 27/00* (2006.01)
*B06B 1/06* (2006.01)
(Continued)

(52) U.S. Cl.
CPC ............ *G02B 27/0006* (2013.01); *B06B 1/06* (2013.01); *B08B 3/02* (2013.01); *B08B 3/12* (2013.01);
(Continued)

(58) Field of Classification Search
CPC ..... G02B 27/0006; B06B 1/06; B06B 1/0651; B08B 3/02; B08B 3/12; B08B 7/028;
(Continued)

(56) References Cited

U.S. PATENT DOCUMENTS 11,235,890 B1 *  2/2022  Dahlstrom ............ B05B 13/005
11,960,076 B2 *  4/2024  Nishiyama ............ B06B 1/0651
(Continued)

FOREIGN PATENT DOCUMENTS

JP    H05032191 U    4/1993
JP    2009247953 A    10/2009
(Continued)

OTHER PUBLICATIONS

JP 2015-223584 (Year: 2015).*
(Continued)

*Primary Examiner* — Alexander Markoff
(74) *Attorney, Agent, or Firm* — Keating & Bennett, LLP

(57) ABSTRACT

A cleaning device includes a housing holding an imaging device, a protective cover located in a field of view of the imaging device, a vibrator to vibrate the protective cover, a piezoelectric driver to drive the vibrator, a cleaning liquid discharger to discharge, onto a surface of the protective cover, a cleaning liquid including an abrasive, and a signal processing circuit to control the piezoelectric driver and the cleaning liquid discharger. When causing the cleaning liquid discharger to discharge the cleaning liquid, the signal processing circuit can control the piezoelectric driver such that the protective cover is vibrated at a vibration acceleration of larger than about $8.0 \times 10^5$ m/s$^2$ and equal to or less than about $21.0 \times 10^5$ m/s$^2$.

19 Claims, 9 Drawing Sheets

(51) Int. Cl.
    *B08B 3/02* (2006.01)
    *B08B 3/12* (2006.01)
    *B08B 7/02* (2006.01)
    *B08B 7/04* (2006.01)
    *B08B 13/00* (2006.01)
    *H04N 23/50* (2023.01)
    *B60S 1/56* (2006.01)

(52) U.S. Cl.
    CPC ............... *B08B 7/028* (2013.01); *B08B 7/04* (2013.01); *B08B 13/00* (2013.01); *H04N 23/50* (2023.01); *B60S 1/56* (2013.01)

(58) Field of Classification Search
    CPC .. B08B 7/04; B08B 13/00; B08B 7/02; H04N 23/50; B60S 1/56; G03B 17/08
    See application file for complete search history.

(56) References Cited

U.S. PATENT DOCUMENTS

| | | | |
|---|---|---|---|
| 2011/0073142 A1* | 3/2011 | Hattori | B60S 1/481 134/198 |
| 2016/0121855 A1 | 5/2016 | Doorley et al. | |
| 2019/0151897 A1 | 5/2019 | Fujimoto et al. | |
| 2020/0057301 A1 | 2/2020 | Kuratani et al. | |
| 2020/0379320 A1 | 12/2020 | Fujimoto et al. | |
| 2021/0294095 A1* | 9/2021 | Nishiyama | B06B 1/0651 |
| 2022/0134760 A1* | 5/2022 | Takata | B60S 1/56 347/14 |
| 2023/0004072 A1* | 1/2023 | Ishii | G03B 17/08 |
| 2023/0258924 A1* | 8/2023 | Nishiyama | B08B 3/02 134/1 |

FOREIGN PATENT DOCUMENTS

| | | |
|---|---|---|
| JP | 2011244417 A | 12/2011 |
| JP | 2013080177 A | 5/2013 |
| JP | 2017085276 A | 5/2017 |
| WO | 2018100796 A1 | 6/2018 |
| WO | 2018198465 A1 | 11/2018 |
| WO | 2020003573 A1 | 1/2020 |
| WO | 2021186898 A1 | 9/2021 |

OTHER PUBLICATIONS

WO 2021/130928 (Year: 2021).*
CN 101463292 (Year: 2009).*
International Search Report in PCT/JP2021/038734, mailed Jan. 11, 2022, 4 pages.
Written Opinion in PCT/JP2021/038734, mailed Jan. 11, 2022, 5 pages.

* cited by examiner

FIG.7
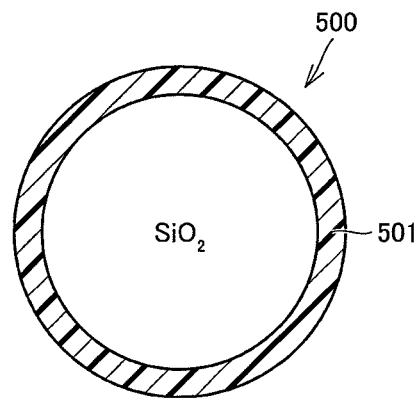
FIG.8
| CONCENTRATION OF ABRASIVE [%] | 0 | 10 | 20 | 30 | 40 | 50 | 75 | 100 |
|---|---|---|---|---|---|---|---|---|
| PRESENCE OR ABSENCE OF SCRATCH | ABSENCE | ABSENCE | ABSENCE | ABSENCE | ABSENCE | PRESENCE | PRESENCE | PRESENCE |
FIG.9
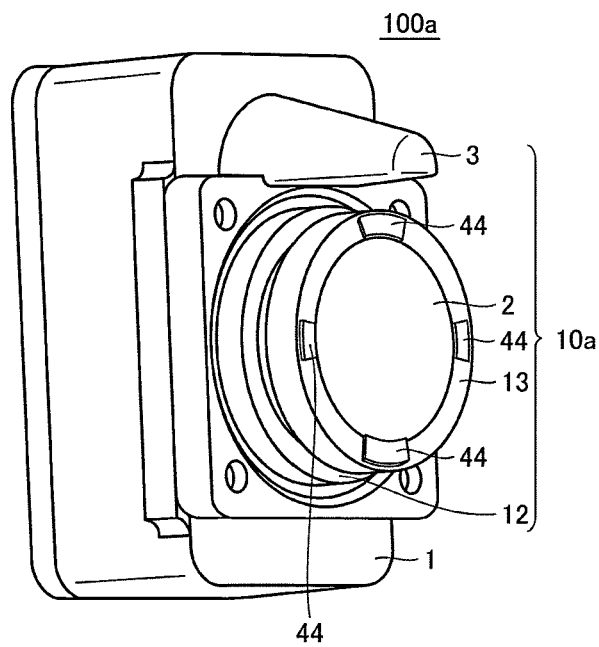

CLEANING DEVICE, IMAGING UNIT INCLUDING CLEANING DEVICE, AND CLEANING METHOD

CROSS REFERENCE TO RELATED APPLICATIONS

This application claims the benefit of priority to Japanese Patent Application No. 2021-018260 filed on Feb. 8, 2021 and Japanese Patent Application No. 2020-177862 filed on Oct. 23, 2020, and is a Continuation Application of PCT Application No. PCT/JP2021/038734 filed on Oct. 20, 2021. The entire contents of each application are hereby incorporated herein by reference.

BACKGROUND OF THE INVENTION

1. Field of the Invention

The present invention relates to a cleaning device, an imaging unit including the cleaning device, and a cleaning method.

2. Description of the Related Art

An imaging unit is provided at a front portion or a rear portion of a vehicle, and a safety device is controlled or automatic drive control is performed by using an image captured by the imaging unit. Since such an imaging unit is often provided outside the vehicle, foreign matters such as raindrops, mud, and dust may adhere to a translucent body (a lens or a protective glass) covering the outside. When foreign matters adhere to the translucent body, the foreign matters adhering to the translucent body are reflected in an image captured by the imaging unit, and a clear image cannot be obtained.

Thus, a cleaning device has been developed that discharges a cleaning liquid onto a surface of a translucent body and that vibrates the translucent body to remove foreign matters (for example, Japanese Unexamined Patent Application Publication No. 2011-244417). In addition, a cleaning device has been developed that removes foreign matters adhering to a surface of a translucent body by operating a wiper blade (for example, U.S. Patent Application Publication No. 2016/0121855).

However, in the cleaning device described in Japanese Unexamined Patent Application Publication No. 2011-244417, when tough dirt, for example, organic matters such as insects, adheres to the surface of the translucent body, there is a case where the dirt cannot be removed only by vibrating the translucent body. In addition, in the cleaning device described in U.S. Patent Application Publication No. 2016/0121855, it is possible to remove tough dirt adhering to the surface of the translucent body by operating the wiper blade. However, since the wiper blade is provided, there are many movable portions and the cleaning device becomes complicated, which increases the possibility of failure.

SUMMARY OF THE INVENTION

Preferred embodiments of the present invention provide cleaning devices that are each able to remove tough dirt (foreign matters) adhering to a translucent body, imaging units each including such a cleaning device, and cleaning methods.

According to a preferred embodiment of the present invention, a cleaning device includes a holder to hold an imaging device, a translucent body located in a field of view of the imaging device, a first vibrator to vibrate the translucent body, a driver to drive the first vibrator, a discharger to discharge, onto a surface of the translucent body, a cleaning liquid including an abrasive, and a controller configured or programmed to control the driver and the discharger, wherein when the controller causes the discharger to discharge the cleaning liquid, the controller controls the driver such that the translucent body is vibrated at a vibration acceleration of larger than about $8.0 \times 10^5$ m/s$^2$ and equal to or less than about $21.0 \times 10^5$ m/s$^2$.

According to a preferred embodiment of the present invention, an imaging unit includes an imaging device and a cleaning device.

According to a preferred embodiment of the present invention, a cleaning method is provided for cleaning a surface of a translucent body by using a cleaning device, the cleaning device including a holder to hold an imaging device, a translucent body located in a field of view of the imaging device, a first vibrator to vibrate the translucent body, one or a plurality of second vibrators located around the translucent body, a driver to drive the first vibrator and the one or the plurality of second vibrators, a discharger to discharge, onto a surface of the translucent body, a cleaning liquid including an abrasive, and a controller configured or programmed to control the driver and the discharger, the cleaning method including controlling a value of a voltage applied to a piezoelectric element of the first vibrator to be larger than about 15 Vp-p and equal to or less than about 40 Vp-p, causing the discharger to discharge the cleaning liquid, vibrating the translucent body discharged with the cleaning liquid by the first vibrator for a first predetermined period of time, controlling a value of a voltage applied to a piezoelectric element of each of the one or the plurality of second vibrators to be equal to or less than about 40 Vp-p, stopping the application of the voltage to the piezoelectric element of each of the one or the plurality of second vibrators after a second predetermined period of time elapses from the application of the voltage to the piezoelectric element of each of the one or the plurality of second vibrators, and stopping the application of the voltage to the piezoelectric element of the first vibrator after a third predetermined period of time elapses from the stop of the application of the voltage to the piezoelectric element of each of the one or the plurality of second vibrators.

According to preferred embodiments of the present invention, the cleaning liquid to which the abrasive is added is discharged onto the surface of the translucent body, and the translucent body is driven so as to vibrate at the vibration acceleration larger than about $8.0 \times 10^5$ m/s$^2$ and equal to or less than about $21.0 \times 10^5$ m/s$^2$. Thus, it is possible to remove tough dirt (foreign matters) adhering to the translucent body.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 7 is a cross-sectional view illustrating an example of an abrasive coated with resin.

FIG. 8 is a table illustrating a relationship between concentration of the abrasive and the presence or absence of a scratch on a surface of the protective cover.

FIG. 9 is a perspective view for explaining a configuration of an imaging unit according to Preferred Embodiment 2 of the present invention.

DETAILED DESCRIPTION OF THE PREFERRED EMBODIMENTS

Figure 1:
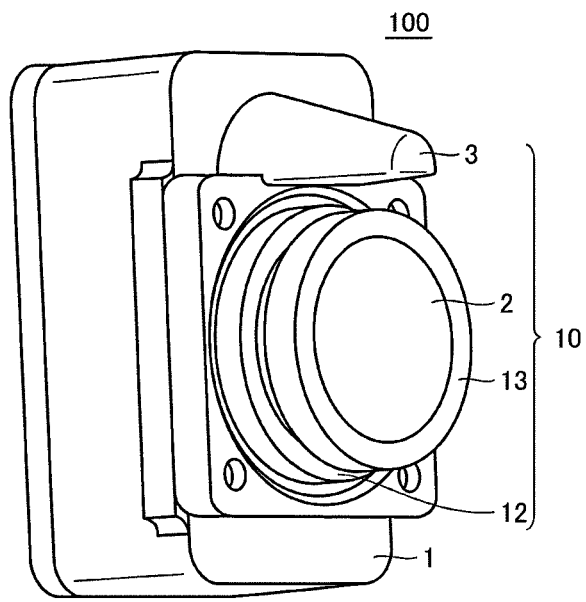
FIG. 1 is a perspective view for explaining a configuration of an imaging unit according to Preferred Embodiment 1 of the present invention.

Hereinafter, imaging units according to preferred embodiments of the present invention will be described in detail with reference to the drawings. In the drawings, the same reference signs represent the same or corresponding portions.

Preferred Embodiment 1

Figure 2:
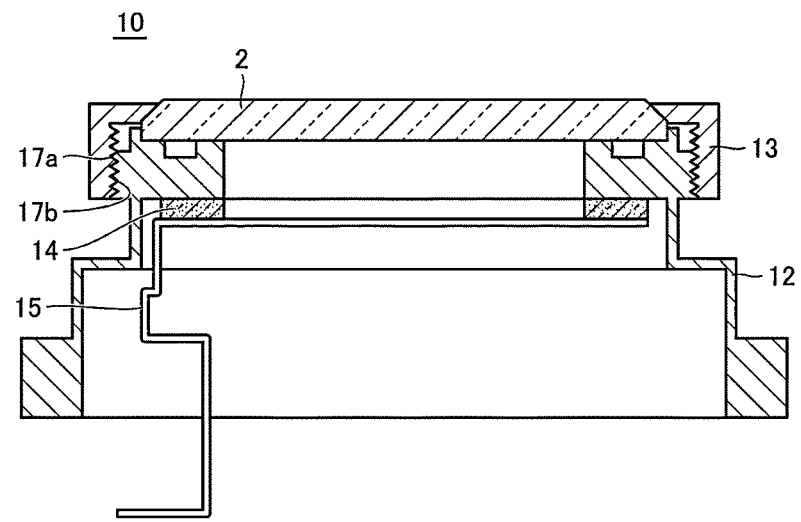
FIG. 2 is a schematic cross-sectional view illustrating a cross-sectional configuration of a cleaning device according to Preferred Embodiment 1 of the present invention.
Figure 3:
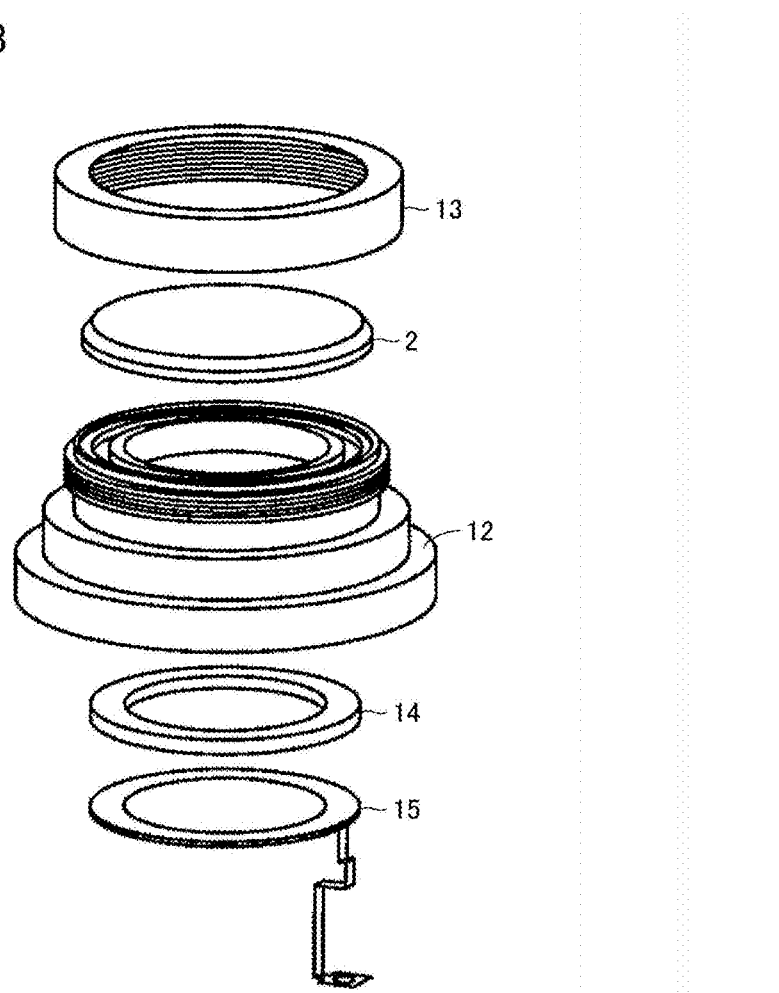
FIG. 3 is an exploded perspective view illustrating elements of the cleaning device according to Preferred Embodiment 1 of the present invention.
Figure 4:
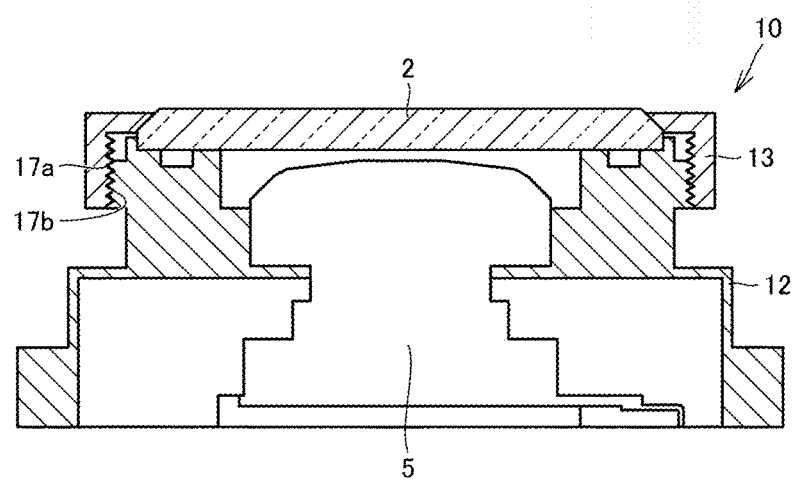
FIG. 4 is a schematic cross-sectional view illustrating a cross-sectional configuration of the imaging unit in which the cleaning device according to Preferred Embodiment 1 of the present invention is provided at the imaging device.

Hereinafter, an imaging unit according to Preferred Embodiment 1 of the present invention will be described with reference to the drawings. FIG. 1 is a perspective view for explaining a configuration of an imaging unit 100 according to Preferred Embodiment 1. FIG. 2 is a schematic cross-sectional view illustrating a cross-sectional configuration of a cleaning device 10 according to Preferred Embodiment 1. FIG. 3 is an exploded perspective view illustrating elements of the cleaning device 10 according to Preferred Embodiment 1. FIG. 4 is a schematic cross-sectional view illustrating a cross-sectional configuration of the imaging unit 100 in which the cleaning device 10 according to Preferred Embodiment 1 is disposed in an imaging device 5.

A portion of the imaging unit 100 illustrated in FIG. 1 excluding the imaging device 5 illustrated in FIG. 4 defines the cleaning device 10. The cleaning device 10 cleans an imaging range of the imaging device 5 by removing foreign matters adhering to a protective cover 2 disposed in front of the imaging device 5.

The cleaning device 10 according to Preferred Embodiment 1 has a configuration to vibrate the protective cover 2 and a configuration to discharge a cleaning liquid onto the protective cover 2. A vibrator 12 provided at a housing 1 is configured to vibrate the protective cover 2 to remove the adhering foreign matters, and a cleaning nozzle 3 that discharges the cleaning liquid onto the protective cover 2 is configured to discharge the cleaning liquid onto the protective cover 2 to remove the adhering foreign matters. The cleaning liquid discharged from the cleaning nozzle 3 includes an abrasive in order to obtain stronger cleaning power. The abrasive is an additive that physically acts on the foreign matters adhering to a surface of the protective cover 2 to polish the foreign matters, and examples of the abrasive include silicon dioxide, cerium oxide, metal, resin balls, and the like.

Further, in the cleaning device 10 according to Preferred Embodiment 1, not only the cleaning liquid including the abrasive is discharged onto the surface of the protective cover 2 but also the protective cover 2 is vibrated such that the discharged cleaning liquid remains on the surface of the protective cover 2. In the cleaning device 10, by holding the cleaning liquid on the surface of the protective cover 2 and vibrating the protective cover 2, it is possible to easily remove the foreign matters adhering to the surface of the protective cover 2, and it is also possible to remove tough dirt (foreign matters), such as dead insects that are difficult to remove by using the abrasive included in the cleaning liquid.

Hereinafter, the configuration of the cleaning device 10 that vibrates the protective cover 2 will be described in more detail. The cleaning device 10 includes the protective cover 2, the vibrator 12 that vibrates the protective cover 2, and a retainer 13 that supports the protective cover 2 at an outer peripheral edge of the protective cover 2. The vibrator 12 is bonded to the protective cover 2 with an adhesive. A material of the adhesive is a hard material such as epoxy resin, for example. The adhesive preferably has a high Young's modulus in order to reduce a vibration loss. The retainer 13 is bonded to the protective cover 2 with an adhesive, is fixed to the vibrator 12, and is in contact with the outer peripheral edge of the protective cover 2 to support the protective cover 2.

As illustrated in FIG. 4, for example, the cleaning device 10 is disposed so as to cover the front surface of an optical element of the imaging device 5 with the protective cover 2, and defines the cleaning device 10 of the imaging unit 100. The imaging device 5 includes, for example, an optical element, an imaging element, a sensor component, and the like therein, and includes a case component that accommodates them.

According to the cleaning device 10, the protective cover 2 and the vibrator 12 can be firmly held and the vibration loss can be reduced or prevented by using an adhesive and mechanical fixing in combination in fixing the protective cover 2 and the vibrator 12.

Protective Cover

Examples of a material of the protective cover 2 include soda glass, borosilicate glass, aluminosilicate glass, and the like. In addition, the protective cover 2 may be, for example, tempered glass whose strength is increased by chemical tempering or the like. The surface of the protective cover 2 may be provided with a coating layer such as, for example, an AR coating, a water-repellent coating, or an impact-resistant coating, as necessary. Further, the protective cover 2 has a circular or substantially circular planar shape, but is not limited thereto. For example, the shape may be a polygonal shape such as a quadrangular shape, a hexagonal shape, or an octagonal shape, or an elliptical shape. Furthermore, the protective cover 2 does not need to have a planar shape, but may have, for example, a hemispherical shape, a shape in which a cylinder is connected to a hemisphere, a curved shape smaller than a hemisphere, or the like.

Vibrator

The vibrator 12 is subjected to threading of a male thread 17a. Examples of a material of the vibrator 12 include metal such as stainless steel, aluminum, iron, titanium, or duralumin. Further, it is preferable that the vibrator 12 has rigidity as high as possible in order to reduce the vibration loss. A surface of the vibrator 12 is preferably subjected to, for example, oxidation treatment or alumite treatment in order to increase the adhesiveness of the adhesive. The vibrator 12 is vibrated by a piezoelectric body 14.

Retainer

The retainer 13 is subjected to threading of a female thread 17b. The female thread 17b is designed to fit with the male thread 17a of the vibrator 12, and is tightened by rotating the retainer 13. A material of the retainer 13 may be plastic as well as metal such as stainless steel, aluminum, iron, titanium, or duralumin, for example. Additionally, a surface state of the retainer 13 is the same as or similar to that of the vibrator 12. However, the retainer 13 does not need to be threaded, and as long as the retainer 13 can be firmly fixed to the vibrator 12, various structures obtained by, for example, fixed fitting, laser welding, or the like can be considered.

In addition, when a material having a specific gravity larger than that of the protective cover 2 is used for the retainer 13, the position of the center of gravity can be set outside an outer periphery of the protective cover 2, which can adjust an amplitude range of the protective cover 2 to be large.

Piezoelectric Body

The piezoelectric body 14 is fixed to the vibrator 12 with an adhesive. Examples of a material of the piezoelectric body 14 include ceramics. In order to apply a potential to an electrode under the piezoelectric body 14, a wiring 15 is fixed to the piezoelectric body 14 with an adhesive. Examples of a material of the wiring 15 include metal having high conductivity such as stainless steel or copper. The wiring 15 may be a wiring provided on a flexible printed circuit (FPC) board. The FPC is a technology widely used, and a typical example thereof is one where a wiring is provided on a polyimide substrate with copper foil. Since the piezoelectric body 14 is ultrasonically vibrated, a vibration loss may be generated when a wiring made of stainless steel, copper, or the like is directly attached to the piezoelectric body 14. On the other hand, since the FPC has flexibility, a potential to the piezoelectric body 14 can be applied without inhibiting vibration. A stress applied to the piezoelectric body 14 at the time of vibration displacement may be reduced by peripheral components. As a result, the displacement of the protective cover 2 linearly increases with respect to an input voltage to the piezoelectric body 14, and excellent removing performance of foreign matters can be obtained.

Cleaning Nozzle

Next, a configuration of the cleaning device 10 that discharges the cleaning liquid onto the protective cover 2 will be described. As illustrated in FIG. 1, the housing 1 is provided with the cleaning nozzle 3 including an opening to discharge the cleaning liquid onto the protective cover 2. The cleaning nozzle 3 has a cylindrical or substantially cylindrical shape, is supplied with the cleaning liquid including an abrasive from an end portion opposite to a side provided with the opening, and discharges the cleaning liquid from the opening to an end of the protective cover 2. The tip of the cleaning nozzle 3 is outside the imaging range (field of view) of the imaging device 5, and the opening is not at a position where the opening is reflected in an image captured by the imaging device 5. Although one cleaning nozzle 3 is provided at the housing 1 in Preferred Embodiment 1, a plurality of cleaning nozzles 3 may be provided at the housing 1.

Figure 5:
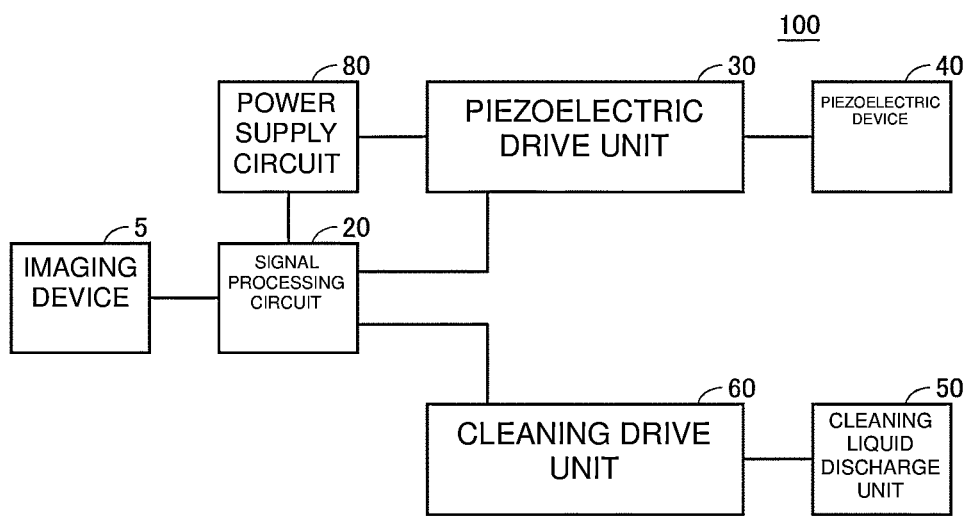
FIG. 5 is a block diagram for explaining control of the cleaning device of the imaging unit according to Preferred Embodiment 1 of the present invention.

Next, control of the cleaning device will be described with reference to the drawings. FIG. 5 is a block diagram for explaining control of the cleaning device of the imaging unit 100 according to Preferred Embodiment 1.

The imaging unit 100 includes the imaging device 5, a signal processing circuit 20, a piezoelectric driver 30, a piezoelectric device 40, a cleaning liquid discharger 50, a cleaning driver 60, and a power supply circuit 80. The signal processing circuit 20 is a controller capable of processing an imaging signal from the imaging device 5 and supplying a control signal to the piezoelectric driver 30 and the cleaning driver 60. In the cleaning liquid discharger 50, a configuration to discharge the cleaning liquid from the opening of the cleaning nozzle 3 is illustrated as one block.

The signal processing circuit 20 is provided with a Central Processing Unit (CPU) as a control center, a Read Only Memory (ROM) storing programs, control data, and the like to operate the CPU, a Random Access Memory (RAM) defining and functioning as a work area of the CPU, an input/output interface to maintain consistency of signals with peripheral devices, and the like.

The piezoelectric driver 30 generates an AC output signal having a frequency f and a voltage V according to the control signal and a drive voltage from the signal processing circuit 20. The piezoelectric device 40 is defined by the vibrator 12 including the piezoelectric body 14 illustrated in FIG. 2, and vibrates the vibrator 12 and the protective cover 2 by applying an AC output signal to the piezoelectric body 14.

By vibrating the protective cover 2, the vibrator 12 can not only remove foreign matters adhering to the protective cover 2 but also cause the protective cover 2 to vibrate and cause the discharged cleaning liquid to remain on the surface of the protective cover 2. The signal processing circuit 20 controls a value of a voltage applied to the piezoelectric body 14 to be, for example, larger than about 15 Vp-p and equal to or smaller than about 40 Vp-p. Thus, the signal processing circuit 20 controls a vibration magnitude of the vibrator 12 and controls a vibration acceleration of the protective cover 2 to be, for example, larger than about $8.0 \times 10^5$ m/s$^2$ and equal to or less than about $21.0 \times 10^5$ m/s$^2$. When the protective cover 2 is vibrated by the vibration of the vibrator 12 at a vibration acceleration larger than about $8.0 \times 10^5$ m/s$^2$ and equal to or less than about $21.0 \times 10^5$ m/s$^2$, the cleaning liquid discharged onto the surface of the protective cover 2 can be retained on the surface of the protective cover 2. This will be described with reference to a graph.

Figure 6:
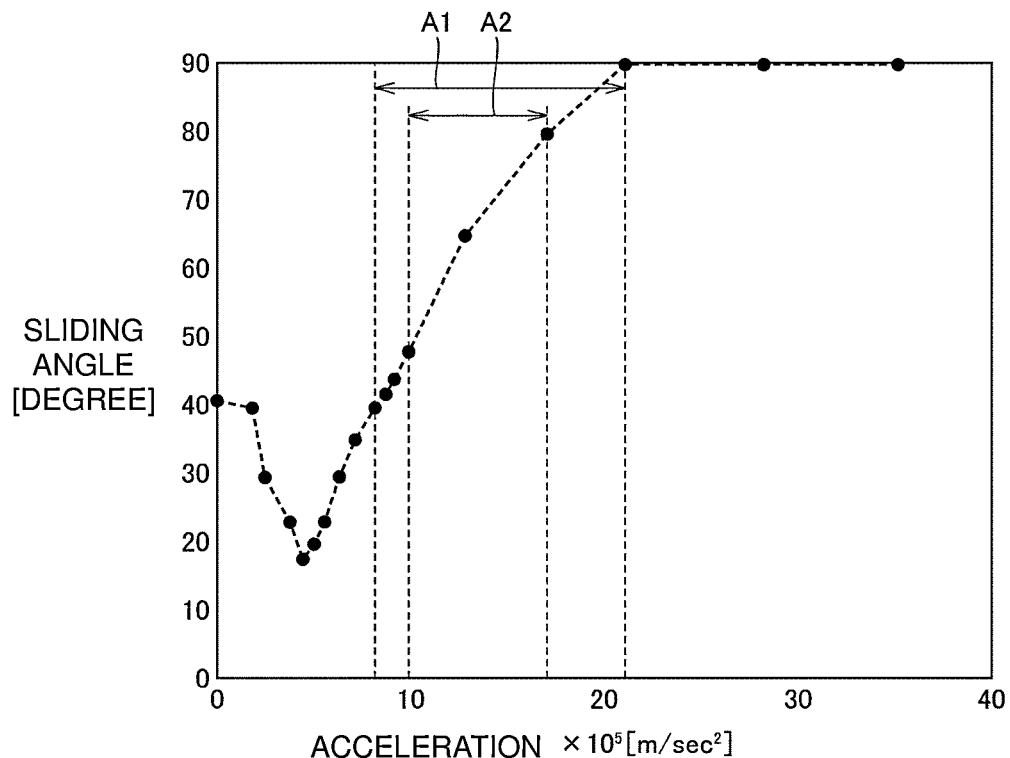
FIG. 6 is a graph illustrating a relationship between a vibration acceleration and a sliding angle of a protective cover in relation to the cleaning device according to Preferred Embodiment 1 of the present invention.

FIG. 6 is a graph illustrating a relationship between a vibration acceleration and a sliding angle of the protective cover 2 in relation to the cleaning device 10 according to Preferred Embodiment 1. The sliding angle is an angle between a horizontal plane and a solid surface at which liquid starts to slide downward when the liquid is caused to adhere on the horizontal solid surface and the solid surface is gradually inclined from the horizontal state. In general, when the sliding angle is small, the liquid is less likely to adhere to the solid surface.

As illustrated in the graph in FIG. 6, when the protective cover 2 is not vibrating (the acceleration is 0), the sliding angle is about 40 degrees, for example. When the vibration acceleration of the protective cover 2 exceeds about $8.0 \times 10^5$ m/s², the sliding angle exceeds about 40 degrees. That is, the liquid on the surface of the protective cover 2 is less likely to drop when the vibration acceleration of the protective cover 2 exceeds about $8.0 \times 10^5$ m/s² than when the protective cover 2 is at rest.

When the vibration acceleration of the protective cover 2 exceeds about $8.0 \times 10^5$ m/s², the liquid (cleaning liquid) discharged onto the surface of the protective cover 2 moves toward a portion of the protective cover 2 having a larger displacement amount, for example, toward a central portion of the protective cover 2. Furthermore, when the vibration acceleration of the protective cover 2 exceeds about $21.0 \times 10^5$ m/s², the sliding angle becomes about 90 degrees. At this time, when the vibration acceleration is further increased, the liquid adhering to the protective cover 2 is atomized by the vibration and removed from the surface of the protective cover 2. As described above, when the vibration acceleration exceeds about $21.0 \times 10^5$ m/s², the liquid discharged onto the surface of the protective cover 2 may be atomized and removed. Thus, when the vibration acceleration of the protective cover 2 is, for example, within a range larger than about $8.0 \times 10^5$ m/s² and equal to or less than about $21.0 \times 10^5$ m/s² ("A1" in FIG. 6), the liquid is easily held on the surface of the protective cover 2.

In Preferred Embodiment 1, when the vibration acceleration of the protective cover 2 is larger than about $8.0 \times 10^5$ m/s² and equal to or less than about $21.0 \times 10^5$ m/s², the displacement amount (a magnitude of amplitude) of the protective cover 2 is, for example, from about 5.5 µm to about 15 µm. When the displacement amount of the protective cover 2 is within this range, the liquid is easily held on the surface of the protective cover 2.

More preferably, the vibration acceleration of the protective cover 2 is, for example, equal to or larger than about $10.0 \times 10^5$ m/s² and equal to or less than about $17.0 \times 10^5$ m/s² ("A2" in FIG. 6). When the sliding angle is within the range of, for example, equal to or larger than about 50 degrees and equal to or less than about 80 degrees, a larger amount of liquid can be held on the surface of the protective cover 2. For this reason, the vibration acceleration is preferably, for example, equal to or larger than about $10.0 \times 10^5$ m/s². Additionally, when the vibration acceleration approaches about $21.0 \times 10^5$ m/s², the liquid may be atomized due to the instability of the circuit or the like. Thus, the vibration acceleration of the protective cover 2 is preferably, for example, equal to or less than about $17.0 \times 10^5$ m/s².

The vibration acceleration was calculated by a method, which will be described below. A signal was supplied to the piezoelectric body 14 having a resonant frequency around 60 kHz by a power supply (E26104A manufactured by Keysight Technologies) and a function generator (AGF1022 manufactured by Tektronix, Inc.) to excite vibration. A displacement of the protective cover 2 excited by the vibration of the piezoelectric body 14 was detected by a laser displacement gauge (BX51M manufactured by Olympus Corporation), and measured by a multimeter (2110 manufactured by Keysight Technologies) and an oscilloscope (oscilloscope TBS1104 manufactured by Tektronix, Inc.). The vibration acceleration was calculated by the equation $\alpha = (2\pi f)2A$, where $\alpha$ is the vibration acceleration, f is a frequency, and A is an amplitude (displacement amount).

As described above, in the cleaning device 10, the protective cover 2 is vibrated to cause the discharged cleaning liquid to remain on the surface of the protective cover 2, such that the abrasive in the cleaning liquid is further stirred to prevent flocculation or precipitation of the abrasive, thus improving the cleaning unevenness. The cleaning device 10 vibrates the protective cover 2 at a first vibration acceleration being equal to or larger than about $10.0 \times 10^5$ m/s² and equal to or less than about $17.0 \times 10^5$ m/s² for a predetermined period of time (for example, after 5 seconds) to stir the abrasive in the cleaning liquid. Thereafter, the cleaning device 10 may vibrate the protective cover 2 at a second vibration acceleration larger than about $17.0 \times 10^5$ m/s² and equal to or less than about $21.0 \times 10^5$ m/s² to cause displacement on the surface of the protective cover 2, and thus, vibrate the cleaning liquid to perform ultrasonic cleaning. According to this, a cleaning ability of the cleaning device 10 is increased, and dirt such as dead insects that cannot be easily removed can be easily removed.

The cleaning ability also depends on a hardness of the abrasive. That is, an abrasive having a higher hardness (for example, quartz, diamond powder, or the like that is used in mechanical polishing) has a higher cleaning ability, but when the hardness of an abrasive is too high, the surface of the protective cover 2 may be scratched. For an imaging unit attached to the outer side of a vehicle in order to obtain information about surroundings of the vehicle, typical dirt (foreign matters) adhering to the surface of the protective cover 2 is organic dirt such as dead insects and inorganic dirt (that may contain organic matters such as oil) obtained by drying mud or an antifreezing agent.

Since the inorganic dirt obtained by drying the mud and the antifreezing agent is an aggregate of particles, the dirt is removed by, as an intuitive image, crushing a mass of dirt rather than scraping off the dirt. Thus, the hardness of the abrasive does not need to be higher than that of the inorganic dirt. The inorganic dirt is softened by discharging the cleaning liquid. In addition, the organic dirt such as dead insects does not have a higher hardness than that of the inorganic dirt. Thus, the hardness of the abrasive may be a hardness to such an extent that the surface of the protective cover 2 is not damaged, and the Mohs hardness of the abrasive may be equal to or less than the Mohs hardness of the protective cover 2. Specifically, when the protective cover 2 is made of, for example, glass, the hardness of the abrasive may be, for example, equal to or less than about 7 in terms of the Mohs hardness, and, for example, cerium oxide, metal, resin balls, or the like can be used as the abrasive. When the protective cover 2 is made of, for example, resin, the hardness of the abrasive is preferably equal to or less than the hardness of the resin.

However, an abrasive having a low hardness generally has a low density, so that the abrasive floats in the cleaning liquid discharged onto the surface of the protective cover 2, and the cleaning ability cannot be sufficiently obtained in some cases. Specifically, when the solvent of the cleaning liquid includes water as a main component, a density of the abrasive is preferably, for example, equal to or larger than about 1.0 g/cm³, and when the solvent of the cleaning liquid includes alcohol as a main component in order to prevent freezing, a density of the abrasive is preferably, for example, equal to or larger than about 0.8 g/cm³. That is, the density of the abrasive is preferably equal to or larger than the density of the solvent of the cleaning liquid.

As an abrasive having an adequately high density and a low hardness, for example, an abrasive where particles of, for example, silicon dioxide ($SiO_2$) are coated with resin may be considered. FIG. 7 is a cross-sectional view illustrating an example of an abrasive 500 that is coated with resin. In the abrasive 500 illustrated in FIG. 7, particles of silicon dioxide ($SiO_2$) are coated with resin 501. Thus, the density of the abrasive 500 is close to the density (about 2.65 g/cm$^3$) of silicon dioxide, and the hardness of the abrasive 500 is close to the hardness of the resin 501. In this way, by considering the hardness of the abrasive, the cleaning ability of the cleaning liquid can be improved without damaging the surface of the protective cover 2.

A coating layer such as, for example, an AR coating, a water-repellent coating, or an impact-resistant coating may be provided on the surface of the protective cover 2 as necessary. For example, by providing a coating layer of a water-repellent coating on the surface of the protective cover 2, it is possible to impart water-repellent and antifouling functions to the protective cover 2. In general, since the coating layer of the water-repellent coating is, for example, a fluorine-based organic matter, the coating layer has a lower hardness than that of the protective cover 2, and is easily damaged by an abrasive. Thus, when the coating layer is provided on the surface of the protective cover 2, the hardness of the abrasive is preferably equal to or lower than the Mohs hardness of the coating layer.

In addition, when concentration of the abrasive in the cleaning liquid is high, the abrasive cannot be appropriately stirred in the cleaning liquid when the cleaning liquid is discharged onto the surface of the protective cover 2. When the protective cover 2 is vibrated in a state where the abrasive cannot be appropriately stirred in the cleaning liquid, the surface of the protective cover 2 may be damaged at a portion where the abrasive densely exists. Thus, it is necessary to consider the concentration of the abrasive in the cleaning liquid. FIG. 8 is a table illustrating a relationship between the concentration of the abrasive and the presence or absence of a scratch on the surface of the protective cover 2. In FIG. 8, a voltage is applied to the piezoelectric body 14, and the protective cover 2 is vibrated at a vibration acceleration of, for example, about $21.0 \times 10^5$ m/s$^2$ for about 100 hours. Silicon dioxide ($SiO_2$) is used as the abrasive, for example. According to the result illustrated in FIG. 8, when the concentration of the abrasive exceeds about 50%, a scratch is generated on the surface of the protective cover 2, so that the concentration of the abrasive is preferably less than about 50%, for example.

The imaging unit 100 according to Preferred Embodiment 1 includes the imaging device 5 and the cleaning device 10. The cleaning device 10 includes the housing 1 that holds the imaging device 5, the protective cover 2 disposed in a field of view of the imaging device 5, the vibrator 12 (first vibrator) that vibrates the protective cover 2, the piezoelectric driver 30 that drives the vibrator 12, the cleaning liquid discharger 50 that discharges, onto the surface of the protective cover 2, the cleaning liquid to which the abrasive is added, and the signal processing circuit 20 that can control the piezoelectric driver 30 and the cleaning liquid discharger 50. When the cleaning liquid is discharged from the cleaning liquid discharger 50, the signal processing circuit 20 can control the piezoelectric driver 30 such that the protective cover 2 is vibrated at a vibration acceleration of, for example, larger than about $8.0 \times 10^5$ m/s$^2$ and equal to or less than about $21.0 \times 10^5$ m/s$^2$.

As a result, the cleaning device 10 according to Preferred Embodiment 1 discharges, onto the surface of the protective cover 2, the cleaning liquid to which the abrasive is added, and drives the protective cover 2 to be vibrated at a vibration acceleration of, for example, larger than about $8.0 \times 10^5$ m/s$^2$ and equal to or less than about $21.0 \times 10^5$ m/s$^2$. Thus, it is possible to remove tough dirt (foreign matters) adhering to the protective cover 2.

The Mohs hardness of the abrasive is preferably equal to or less than the Mohs hardness of the protective cover 2. Thus, the cleaning ability of the cleaning device 10 can be improved without damaging the surface of the protective cover 2.

The density of the abrasive is preferably equal to or higher than the density of the solvent of the cleaning liquid. Thus, the abrasive does not float in the cleaning liquid, and the cleaning ability of the cleaning device 10 can be improved.

The concentration of the abrasive is preferably less than about 50%. Due to this, the abrasive is stirred in the cleaning liquid, so that the surface of the protective cover 2 is not locally damaged, and the cleaning ability of the cleaning device 10 can be improved.

It is preferable that a coating layer is provided on the surface of the protective cover 2. This can provide water-repellent and antifouling functions, and the like to the surface of the protective cover 2.

The Mohs hardness of the abrasive is preferably equal to or less than the Mohs hardness of the coating layer instead of the Mohs hardness of the protective cover 2. Thus, the cleaning ability of the cleaning device 10 can be improved without damaging the surface of the coating layer.

It is preferable that the vibrator 12 include the piezoelectric body 14 (piezoelectric element), and the signal processing circuit 20 can control the vibration acceleration by controlling a value of a voltage applied to the piezoelectric body 14 to be, for example, larger than about 15 Vp-p and equal to or smaller than about 40 Vp-p. Thus, the vibrator 12 can drive the protective cover 2 to be vibrated at a vibration acceleration of, for example, larger than about $8.0 \times 10^5$ m/s$^2$ and equal to or less than about $21.0 \times 10^5$ m/s$^2$.

The signal processing circuit 20 can control the piezoelectric driver 30 to vibrate the protective cover 2 both at the first vibration acceleration of, for example, larger than about $8.0 \times 10^5$ m/s$^2$ and equal to or less than about $21.0 \times 10^5$ m/s$^2$ and at the second vibration acceleration of faster than the first vibration acceleration. It is preferable that the signal processing circuit 20 can vibrate the protective cover 2 at the second vibration acceleration after vibrating the protective cover 2 discharged with the cleaning liquid at the first vibration acceleration for a predetermined period of time. Thus, since ultrasonic cleaning is performed by vibrating the cleaning liquid after the abrasive in the cleaning liquid is stirred, the cleaning ability of the cleaning device 10 can be improved.

Preferred Embodiment 2

In the cleaning device 10 according to Preferred Embodiment 1, the configuration has been described in which the cleaning liquid discharged onto the surface of the protective cover 2 is retained on the surface of the protective cover 2 by the vibrator 12, and the retained cleaning liquid is vibrated by the vibrator 12 to perform ultrasonic cleaning. In a cleaning device according to Preferred Embodiment 2 of the present invention, a configuration in which cleaning is performed by vibrating the retained cleaning liquid with a separately provided vibrator will be described.

Figure 10:
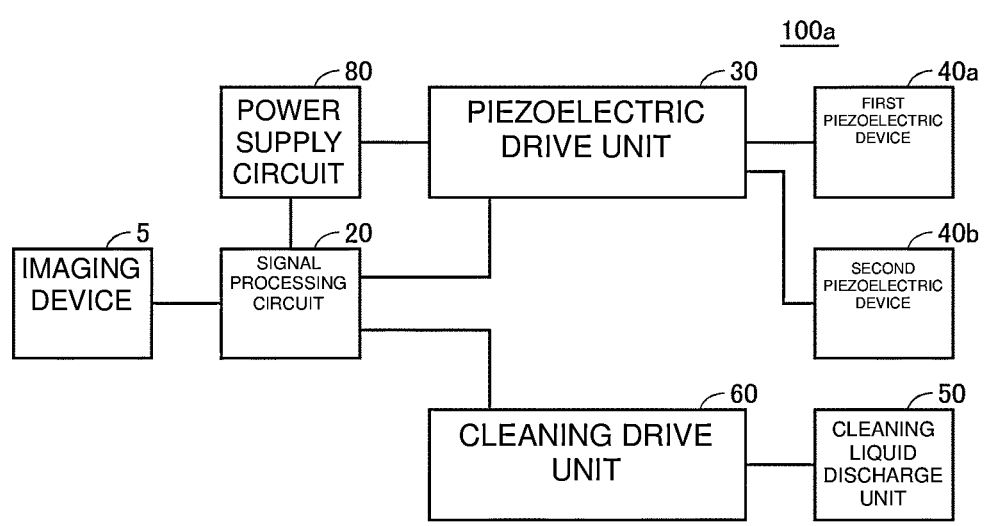
FIG. 10 is a block diagram for explaining control of a cleaning device of the imaging unit according to Preferred Embodiment 2 of the present invention.

FIG. 9 is a perspective view for explaining the configuration of an imaging unit 100a according to Preferred Embodiment 2. FIG. 10 is a block diagram for explaining control of a cleaning device 10a of the imaging unit 100a according to Preferred Embodiment 2. Elements in the configurations of the imaging unit 100a and the cleaning device 10a according to Preferred Embodiment 2 that are the same as or correspond to elements in the configurations of the imaging unit 100 and the cleaning device 10 according to Preferred Embodiment 1 are denoted by the same reference signs, and detailed description thereof will not be repeated.

In the imaging unit 100a according to Preferred Embodiment 2, as illustrated in FIG. 9, piezoelectric bodies 44 (second vibrators) are attached to the retainer 13 provided around the protective cover 2. Vibration is applied to the cleaning liquid held on the surface of the protective cover 2 by the piezoelectric bodies 44, and the surface of the protective cover 2 can be cleaned by ultrasonic cleaning. For example, four piezoelectric bodies 44 are provided at equal or substantially equal intervals around the protective cover 2. The number of the piezoelectric bodies 44 is not limited to four, and may be two or more. By providing a plurality of piezoelectric bodies 44 at equal or substantially equal intervals, the entire surface of the protective cover 2 can be uniformly cleaned. In addition, the shape of the piezoelectric body 44 may be an annular shape that is partially discontinued.

The piezoelectric bodies 44 are arranged at positions that are outside the imaging range (field of view) of the imaging device 5, that are not reflected in an image captured by the imaging device 5, and that are in contact with the cleaning liquid remaining on the surface of the protective cover 2. The piezoelectric bodies 44 can vibrate the cleaning liquid held on the surface of the protective cover 2 to clean the surface of the protective cover 2.

As the piezoelectric bodies 44, for example, PZT-based piezoelectric ceramics can be used. Additionally, other piezoelectric ceramics such as, for example, $(K, Na)NbO_3$ may be used for the piezoelectric bodies 44. Furthermore, a piezoelectric single crystal such as, for example, $LiTaO_3$ may be used for the piezoelectric bodies 44. Additionally, in order to improve the reliability of the piezoelectric bodies 44, the piezoelectric bodies 44 may be covered with a highly reliable member such as, for example, glass, alumina, Teflon (a registered trademark), or stainless steel (SUS303).

The piezoelectric body 44 is connected to a power supply conductor (not illustrated). The piezoelectric body 44 vibrates by being supplied with power from the power supply conductor. That is, the piezoelectric body 44 vibrates by being applied with a voltage from the power supply conductor.

The piezoelectric bodies 44 can vibrate the cleaning liquid held on the surface of the protective cover 2 at a low frequency (for example, several tens of kHz) or a high frequency (for example, several MHz) according to a state of dirt on the protective cover 2. By vibrating the cleaning liquid remaining on the surface of the protective cover 2 by the piezoelectric bodies 44, the dirt on the surface of the protective cover 2 can be removed by ultrasonic cleaning.

When the frequency of the piezoelectric body 44 is high, that is, when the cleaning liquid on the surface of the protective cover 2 is vibrated at a high frequency, cleaning can be performed with less damage to the protective cover 2. On the other hand, when the frequency of the piezoelectric body 44 is low, that is, when the cleaning liquid on the surface of the protective cover 2 is vibrated at a low frequency, cleaning power is increased and cleaning can be performed in a short period of time. Thus, for example, low-frequency vibration having strong cleaning power may be used for highly viscous dirt (mud, oil, or the like), or high-frequency vibration may be used when it is desired to reduce or prevent damage to the protective cover 2. That is, the frequency of the piezoelectric body 44 may be changed according to the application.

The imaging unit 100a illustrated in FIG. 10 includes the imaging device 5, the signal processing circuit 20, the piezoelectric driver 30, a first piezoelectric device 40a, a second piezoelectric device 40b, the cleaning liquid discharger 50, the cleaning driver 60, and the power supply circuit 80.

The first piezoelectric device 40a is defined by the vibrator 12 including the piezoelectric body 14 illustrated in FIG. 2, and vibrates the vibrator 12 and the protective cover 2 by applying an AC output signal to the piezoelectric body 14. The second piezoelectric device 40b is defined by the piezoelectric body 44 illustrated in FIG. 9, and vibrates the cleaning liquid remaining on the surface of the protective cover 2 by applying an AC output signal to the piezoelectric body 44.

Figure 11:
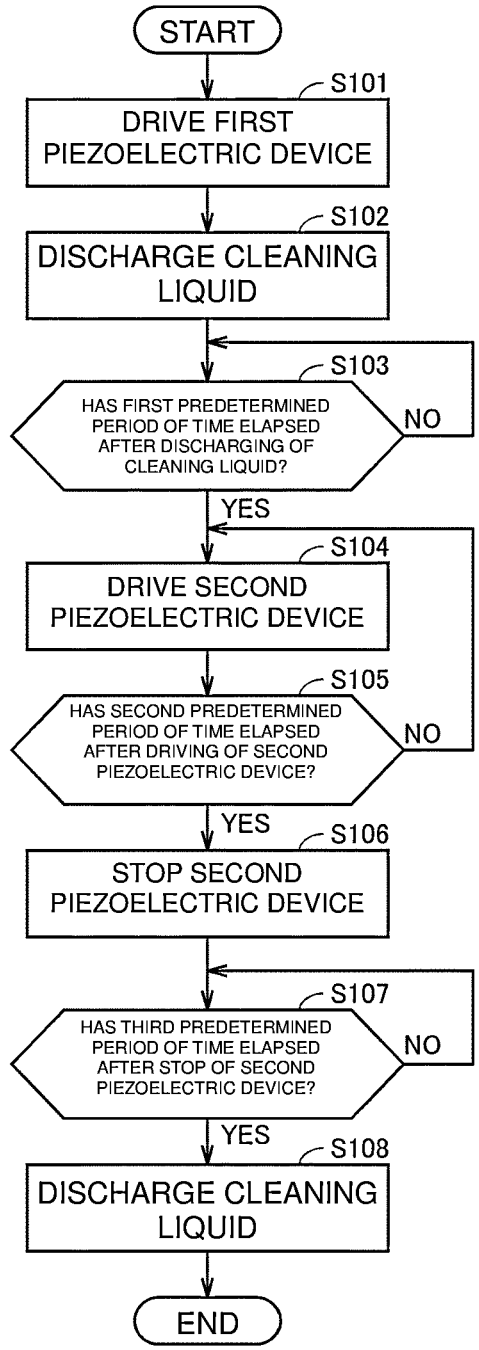
FIG. 11 is a flowchart for explaining an operation of the cleaning device of the imaging unit according to Preferred Embodiment 2 of the present invention.

Next, FIG. 11 is a flowchart for explaining an operation of the cleaning device 10a of the imaging unit 100a according to Preferred Embodiment 2. First, when the cleaning device 10a starts a cleaning operation, the signal processing circuit 20 drives the first piezoelectric device 40a (step S101). To be more specific, the signal processing circuit 20 controls a value of a voltage applied from the piezoelectric driver 30 to the piezoelectric body 14 to be, for example, larger than about 15 Vp-p and equal to or less than about 40 Vp-p, and vibrates the protective cover 2 so that the discharged cleaning liquid can remain on the surface of the protective cover 2. In a state where the first piezoelectric device 40a is driven, the signal processing circuit 20 drives the cleaning driver 60 to cause the cleaning liquid discharger 50 to discharge the cleaning liquid onto the surface of the protective cover 2 (step S102).

The signal processing circuit 20 determines whether or not a first predetermined period of time has elapsed after the cleaning liquid is discharged onto the surface of the protective cover 2 (step S103). By driving the first piezoelectric device 40a, the cleaning liquid can be retained on the surface of the protective cover 2, and the abrasive in the cleaning liquid can be stirred by the vibration of the first piezoelectric device 40a. The period of time required for stirring the abrasive is set to the first predetermined period of time, for example, to be equal to or longer than about 5 seconds.

Figure 12:
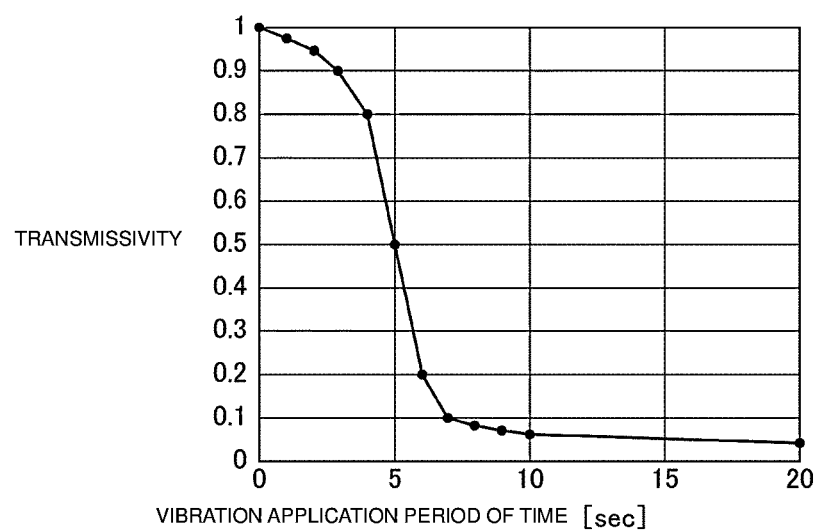
FIG. 12 is a graph illustrating a period of time related to stirring of an abrasive when vibration is applied to a cleaning liquid.

FIG. 12 is a graph illustrating a period of time related to stirring of the abrasive when vibration is applied to the cleaning liquid. FIG. 12 illustrates a change in transmissivity when a voltage of, for example, about 40 Vp-p is applied to the piezoelectric body 14 of the first piezoelectric device 40a to vibrate the protective cover 2 discharged with the cleaning liquid, with the vertical axis representing transmissivity and the horizontal axis representing a vibration application period of time (unit: sec.). When the abrasive precipitated in the cleaning liquid is stirred, the transmissivity decreases. Here, the transmissivity is indicated by a numerical value normalized by setting the initial state without stirring to 1. In the graph illustrated in FIG. 12, for example, when the vibration application period of time is about 5 seconds, the transmissivity is about 0.5. From this result, as a period of time for stirring the abrasive in the cleaning liquid by the vibration of the first piezoelectric device 40a, a period of time of, for example, equal to or longer than about 5 seconds in which the transmissivity becomes equal to or less than about 0.5 is required.

When the first predetermined period of time has not elapsed (NO in step S103), the signal processing circuit 20 returns the processing to step S103 and continues driving the first piezoelectric device 40a. When the first predetermined period of time has elapsed (YES in step S103), the signal processing circuit 20 drives the second piezoelectric device 40b (step S104). To be more specific, the signal processing circuit 20 controls a value of a voltage applied from the piezoelectric driver 30 to the piezoelectric bodies 44 of the second piezoelectric device 40b to be, for example, equal to or less than about 40 Vp-p to vibrate the cleaning liquid held on the surface of the protective cover 2.

The signal processing circuit 20 determines whether or not the second predetermined period of time has elapsed after driving the second piezoelectric device 40b (step S105). The second predetermined period of time is set to a period of time sufficient to clean the dirt on the surface of the protective cover 2, for example, to several tens of seconds. In a case where the second predetermined period of time has not elapsed (NO in step S105), the signal processing circuit 20 returns the processing to step S104, and the driving of the second piezoelectric device 40b is continued. In a case where the second predetermined period of time has elapsed (YES in step S105), the signal processing circuit 20 stops driving the second piezoelectric device 40b (step S106). To be more specific, the signal processing circuit 20 turns off a voltage applied to one or a plurality of piezoelectric bodies 44 each of which is included in the second piezoelectric device 40b. The one or the plurality of piezoelectric bodies are provided around the protective cover 2 and configured to apply vibration that provides an ultrasonic cleaning effect to the cleaning liquid.

The signal processing circuit 20 determines whether or not a third predetermined period of time has elapsed after stopping the driving of the second piezoelectric device 40b (step S107). The third predetermined period of time is set to, for example, several seconds as a period of time for stirring the abrasive, dirt, and the like in the cleaning liquid. In a case where the third predetermined period of time has not elapsed (NO in step S107), the signal processing circuit 20 returns the processing to step S107 and continues to drive the first piezoelectric device 40a. In a case where the third predetermined period of time has elapsed (YES in step S107), the signal processing circuit 20 stops driving the first piezoelectric device 40a (step S108). To be more specific, the signal processing circuit 20 controls the voltage applied to the piezoelectric body 14 of the first piezoelectric device 40a that vibrates the protective cover 2 to be turned off.

By stopping the driving of the first piezoelectric device 40a, the cleaning liquid remaining on the surface of the protective cover 2 is caused to slide down together with dirt, and the cleaning operation of the cleaning device 10a is ended.

As described above, the cleaning device 10a according to Preferred Embodiment 2 further includes one or a plurality of piezoelectric bodies 44 (second piezoelectric devices 40b) provided around the protective cover 2, and the piezoelectric driver 30 drives the piezoelectric bodies 44. Thus, the abrasive in the cleaning liquid can be stirred due to the vibration of the piezoelectric bodies 44.

It is preferable that the signal processing circuit 20 can vibrate the cleaning liquid on the surface of the protective cover 2 by the second piezoelectric device 40b after vibrating the protective cover 2 discharged with the cleaning liquid by the first piezoelectric device 40a for a predetermined period of time. Thus, the cleaning liquid can remain on the surface of the protective cover 2, and the abrasive in the cleaning liquid can be stirred due to the vibration of the piezoelectric bodies 44.

The predetermined period of time is preferably, for example, equal to or longer than about 5 seconds. Thus, the abrasive in the cleaning liquid can be sufficiently stirred due to the vibration of the piezoelectric bodies 44.

A cleaning method for cleaning the surface of the protective cover 2 by using the cleaning device 10a includes controlling a value of a voltage applied to the piezoelectric body 14 of the first piezoelectric device 40a to be, for example, larger than about 15 Vp-p and equal to or less than about 40 Vp-p, causing the cleaning liquid discharger 50 to discharge the cleaning liquid, vibrating the protective cover 2 discharged with the cleaning liquid by the first piezoelectric device 40a for the first predetermined period of time (for example, about 5 seconds), controlling a value of a voltage applied to the piezoelectric body 44 of the second piezoelectric device 40b to be, for example, equal to or less than about 40 Vp-p, stopping the application of the voltage to the piezoelectric body 44 of the second piezoelectric device 40b after the second predetermined period of time (for example, several tens of seconds) elapses from the application of the voltage to the piezoelectric body 44 of the second piezoelectric device 40b, and stopping the application of the voltage to the piezoelectric body 14 of the first piezoelectric device 40a after the third predetermined period of time (for example, several seconds) elapses from the stop of the application of the voltage to the piezoelectric body 44 of the second piezoelectric device 40b.

As a result, the cleaning device 10a according to Preferred Embodiment 2 can discharge, onto the surface of the protective cover 2, the cleaning liquid to which the abrasive is added, drive the first piezoelectric device 40a such that the protective cover 2 is vibrated at a vibration acceleration of, for example, larger than about $8.0 \times 10^5$ m/s$^2$ and equal to or less than about $21.0 \times 10^5$ m/s$^2$, and apply vibration to the cleaning liquid held on the surface of the protective cover 2 by the second piezoelectric device 40b to clean the protective cover 2, which can remove tough dirt (foreign matters) adhering to the protective cover 2.

Preferred Embodiment 3

In the cleaning device 10 according to Preferred Embodiment 1, the configuration has been described in which the cleaning liquid to which the abrasive is added is retained on the surface of the protective cover 2 by the vibrator 12, and the retained cleaning liquid is vibrated by the vibrator 12 to perform ultrasonic cleaning. In a cleaning device according to Preferred Embodiment 3 of the present invention, a configuration to adjust concentration of the abrasive added to the cleaning liquid in order to improve cleaning performance will be described.

An imaging unit and a cleaning device according to Preferred Embodiment 3 have the same or substantially the same configurations as those of the imaging unit 100 and the cleaning device 10 according to Preferred Embodiment 1, and the same or corresponding elements are denoted by the same reference signs and detailed description thereof will not be repeated. The configurations of the imaging unit 100a and the cleaning device 10a according to Preferred Embodiment 2 may be used for the configurations of the imaging unit and the cleaning device according to Preferred Embodiment 3.

In the cleaning device according to Preferred Embodiment 3, in order to adjust the concentration of the abrasive added to the cleaning liquid, the signal processing circuit 20 vibrates the protective cover 2 at a vibration acceleration, for example, exceeding about $21.0 \times 10^5$ m/s² to atomize the liquid contained in the cleaning liquid discharged onto the surface of the protective cover 2, thus reducing the weight of the cleaning liquid. For example, in the cleaning liquid discharged onto the surface of the protective cover 2, the abrasive of, for example, about 0.05 mg is added to the liquid of about 0.95 mg, and the concentration of the abrasive is, for example, about 5 wt. %. When the liquid of, for example, about 0.8 mg is atomized from the cleaning liquid by the vibration of the protective cover 2 to reduce the weight of the liquid of the cleaning liquid, the concentration of the abrasive becomes, for example, about 25 wt. % in which the abrasive of about 0.05 mg is added to the liquid of about 0.15 mg.

Figure 13:
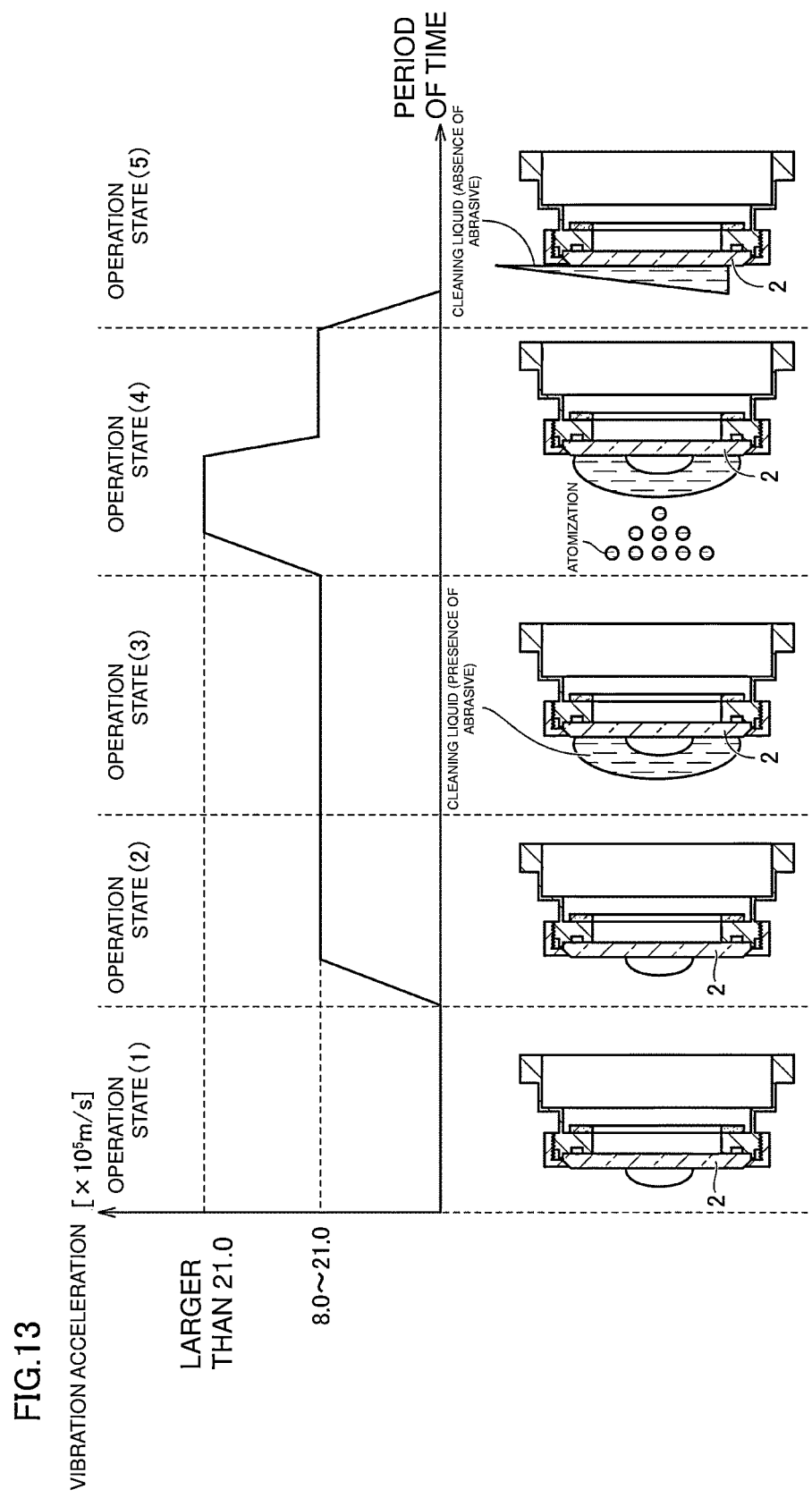
FIG. 13 is a schematic view for explaining an operation of a cleaning device according to Preferred Embodiment 3 of the present invention.

An operation of the cleaning device according to Preferred Embodiment 3 including the operation to adjust the concentration of the abrasive added to the cleaning liquid will be described with reference to the drawings. FIG. 13 is a schematic diagram for explaining the operation of the cleaning device according to Preferred Embodiment 3. In the upper portion of FIG. 13, a graph illustrating the displacement of a vibration acceleration of the protective cover 2 in each operation state is illustrated, and in the lower portion of FIG. 13, an image diagram illustrating a surface state of the protective cover 2 in each operation state is illustrated. In the upper graph of FIG. 13, the vertical axis represents a vibration acceleration (unit: m/s²) and the horizontal axis represents an operation period of time of the cleaning device.

First, an operation state (1) is a state in which foreign matters are adhering onto the surface of the protective cover 2, and a state in which the cleaning device has not yet started an operation. The cleaning device can detect the fact that the foreign matters have adhered onto the surface of the protective cover 2, for example, by analyzing an image captured by the imaging device 5 or by monitoring a change in impedance of the piezoelectric body 14 with a current.

When the cleaning device determines that the foreign matters have adhered onto the surface of the protective cover 2 in an operation state (2), the cleaning device drives the protective cover 2 to vibrate at a vibration acceleration larger than about $8.0 \times 10^5$ m/s² and equal to or less than about $21.0 \times 10^5$ m/s². By vibrating the protective cover 2 at the vibration acceleration, the cleaning device can perform driving without causing the cleaning liquid to slip down from the protective cover 2 and without causing the liquid of the cleaning liquid to be atomized even when the cleaning liquid is discharged onto the surface of the protective cover 2.

The cleaning device according to Preferred Embodiment 3 has a configuration in which the cleaning liquid to which the abrasive is added and the cleaning liquid to which no abrasive is added can be switched and discharged onto the surface of the protective cover 2, although the configuration is not illustrated. Specifically, as the configuration for switching between the cleaning liquid to which the abrasive is added and the cleaning liquid to which no abrasive is added, for example, a configuration may be considered in which a tank storing the cleaning liquid to which the abrasive is added and a tank storing the cleaning liquid to which no abrasive is added are provided, and switching is performed depending on from which tank the cleaning liquid is discharged. In addition, for example, a configuration may be considered in which a tank storing the cleaning liquid to which no abrasive is added and a mechanism to add the abrasive between the tank and the opening of the cleaning nozzle 3 are provided, and switching is performed by adding the abrasive by the mechanism when the cleaning liquid is discharged.

Next, in a cleaning operation state (3), the cleaning device discharges, onto the surface of the protective cover 2, the cleaning liquid to which the abrasive is added. Since the cleaning device vibrates the protective cover 2 while maintaining the vibration acceleration in the operation state (2), the discharged cleaning liquid continues to remain on the surface of the protective cover 2 without slipping down from the protective cover 2, thus removing strongly adhering foreign matters such as dirt and insects.

However, when the foreign matters cannot be removed even when the cleaning device operates in the operation state (3), the cleaning device adjusts the concentration of the abrasive added to the cleaning liquid to improve the cleaning performance in order to remove the foreign matters. In detail, for example, the cleaning device drives the protective cover 2 to vibrate at a vibration acceleration of larger than about $21.0 \times 10^5$ m/s² in an operation state (4). The cleaning device vibrates the protective cover 2 at the vibration acceleration to atomize the liquid of the cleaning liquid discharged onto the surface of the protective cover 2 to change the weight of the liquid of the cleaning liquid, thus adjusting the concentration of the abrasive, for example, from about 5 wt. % to about 25 wt. %.

Figure 14:
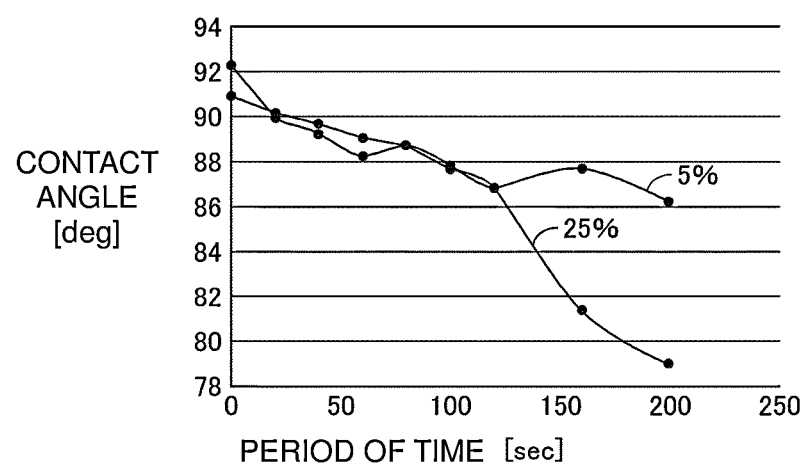
FIG. 14 is a graph comparing cleaning performance at different concentrations of the abrasive.

Here, an example in which the cleaning performance of the cleaning device is improved by adjusting the concentration of the abrasive to be high will be described. FIG. 14 is a graph comparing cleaning performance at different abrasive concentrations. In the example illustrated in FIG. 14, water-repellent dirt was attached to the surface of the protective cover 2, and the cleaning performance was evaluated based on removal amounts of the water-repellent dirt after cleaning with cleaning liquids having different concentrations of the abrasive. The removal amounts of the water-repellent dirt were evaluated by a magnitude of a contact angle of liquid dropped onto the surface of the protective cover 2 after cleaning. That is, the smaller the contact angle of the liquid, the larger the removal amount of the water-repellent dirt. In the graph of FIG. 14, the vertical axis represents a contact angle (unit: deg) and the horizontal axis represents an operation period of time (unit: sec) of the cleaning device. Note that ISO 12103-1 AC dust (Fine) of The Association of Powder Process Industry and Engineering, JAPAN was used as the abrasive.

As can be seen from the graph in FIG. 14, compared with the case where the concentration of the abrasive is about 5 wt. %, the removal amount of the water-repellent dirt is large in the case where the concentration of the abrasive is about 25 wt. %, which means that the cleaning performance of the cleaning device is improved. It is considered that when the concentration of the abrasive is increased, the density of the abrasive in the cleaning liquid is increased, and the amount of the abrasive physically acting on foreign matters adhering to the surface of the protective cover 2 is increased to improve the cleaning performance of the cleaning device.

After the concentration of the abrasive is adjusted, for example, from about 5 wt. % to about 25 wt. % in the operation state (4), the cleaning device returns the driving such that the protective cover 2 is vibrated at the vibration acceleration larger than about $8.0 \times 10^5$ m/s² and equal to or less than about $21.0 \times 10^5$ m/s². In order to adjust the concentration of the abrasive, the cleaning device adjusts a period of time for atomizing the liquid of the cleaning liquid. That is, the cleaning device includes an amount of liquid that can be atomized per unit period of time (for example, second) by driving the protective cover 2 to be vibrated at a vibration acceleration of larger than about $21.0\times10^5$ m/s$^2$ in advance. In the cleaning device, in order to obtain a desired concentration of the abrasive, the vibration period of time can be set by dividing the amount of liquid to be atomized from the discharged cleaning liquid by the amount of liquid that can be atomized per unit period of time. The cleaning device may be configured to additionally discharge the cleaning liquid to which no abrasive is added when the concentration of the abrasive becomes higher than the desired concentration.

In the operation state (4), when the concentration of the abrasive is increased to improve the cleaning performance to clean the surface of the protective cover 2, and the foreign matters adhering to the surface of the protective cover 2 can be removed, the cleaning device shifts to the next operation state. The cleaning device can detect the removal of the foreign matters adhering to the surface of the protective cover 2, for example, by analyzing an image captured by the imaging device 5 or by monitoring a change in impedance of the piezoelectric body 14 with a current.

In the operation state (5), the cleaning device discharges, onto the surface of the protective cover 2, the cleaning liquid to which no abrasive is added. That is, the cleaning device cleans the surface of the protective cover 2 with the cleaning liquid to which no abrasive is added such that the abrasive whose concentration is increased in the operation state (4) does not remain on the surface of the protective cover 2. Thus, in the cleaning device, even when dirt or the abrasive remains at the maximum displacement portion of the protective cover 2, the dirt or the abrasive can be removed by the cleaning liquid to which no abrasive is added.

As described above, in the cleaning device according to Preferred Embodiment 3, the signal processing circuit 20 can adjust the concentration of the abrasive added to the cleaning liquid discharged onto the surface of the protective cover 2. Thus, the cleaning device can further improve the cleaning performance, and can also remove tough dirt (foreign matters) such as dead insects that are more difficult to remove.

In addition, it is preferable that the signal processing circuit 20 can control the driver such that the protective cover 2 is vibrated at a vibration acceleration of, for example, larger than about $21.0\times10^5$ m/s$^2$, atomize the liquid of the cleaning liquid discharged onto the surface of the translucent body, and adjust the concentration of the abrasive added to the cleaning liquid. Thus, the cleaning device can adjust the concentration of the abrasive added to the cleaning liquid without adding another configuration.

Furthermore, it is preferable that the cleaning liquid discharger 50 can switch between discharging the cleaning liquid to which the abrasive is added and discharging the cleaning liquid to which no abrasive is added onto the surface of the protective cover 2. Thus, the cleaning device can select whether to discharge the cleaning liquid to which the abrasive is added or discharge the cleaning liquid to which no abrasive is added, depending on the degree of the foreign matters adhering to the surface of the protective cover 2.

In addition, it is preferable that the signal processing circuit 20 can discharge, onto the surface of the protective cover 2, the cleaning liquid to which no abrasive is added after cleaning the surface of the protective cover 2 with the cleaning liquid to which the abrasive is added. As a result, the cleaning device can remove the dirt and the abrasive remaining on the surface of the protective cover 2 with the cleaning liquid to which no abrasive is added.

Other Modifications

In the imaging unit according to the above-described preferred embodiments, the configuration of the imaging device 5 is not particularly described in detail, but the imaging device 5 may include, for example, a camera, a LiDAR, a Rader, or the like.

In the imaging unit according to the above-described preferred embodiments, one cleaning nozzle 3 is provided at the housing 1 as illustrated in FIG. 1, but the present invention is not limited to this configuration, and a plurality of cleaning nozzles 3 may be provided at the housing 1.

The imaging unit according to the above-described preferred embodiments is not limited to an imaging unit to be provided in a vehicle, and can be similarly applied to an imaging unit for an application in which the translucent body disposed in the field of view of the imaging device 5 needs to be cleaned.

In the cleaning device according to Preferred Embodiment 3 described above, the cleaning liquid discharger 50 is configured to be capable of switching between discharging the cleaning liquid to which the abrasive is added and discharging the cleaning liquid to which no abrasive is added onto the surface of the protective cover 2. However, the configuration may be provided at the cleaning device 10 and 10a according to the Preferred Embodiments 1 and 2.

In the cleaning device according to Preferred Embodiment 3 described above, adjusting the concentration of the abrasive by atomizing the liquid included in the cleaning liquid discharged onto the surface of the protective cover 2 has been described. However, the present invention is not limited thereto. For example, as long as the cleaning device includes a tank to store the cleaning liquid to which no abrasive is added and a mechanism to add the abrasive between the tank and the opening of the cleaning nozzle 3, the concentration of the abrasive can be adjusted by the amount of the abrasive to be added to the cleaning liquid to be discharged.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A cleaning device comprising:
a holder to hold an imaging device;
a translucent body located in a field of view of the imaging device;
a first vibrator to vibrate the translucent body;
a driver to drive the first vibrator;
a discharger to discharge, onto a surface of the translucent body, a cleaning liquid including an abrasive; and
a controller configured or programmed to control the driver and the discharger; wherein
when the controller causes the discharger to discharge the cleaning liquid, the controller controls the driver such that the translucent body is vibrated at a vibration acceleration of larger than about $8.0\times10^5$ m/s$^2$ and equal to or less than about $21.0\times10^5$ m/s$^2$.

2. The cleaning device according to claim 1, wherein a Mohs hardness of the abrasive is equal to or less than a Mohs hardness of the translucent body.

3. The cleaning device according to claim 1, wherein a density of the abrasive is equal to or larger than a density of a solvent of the cleaning liquid.

4. The cleaning device according to claim 1, wherein a concentration of the abrasive is less than about 50%.

5. The cleaning device according to claim 1, wherein a coating layer is provided on the surface of the translucent body.

6. The cleaning device according to claim 5, wherein a Mohs hardness of the abrasive is equal to or less than a Mohs hardness of the coating layer.

7. The cleaning device according to claim 1, wherein
the first vibrator includes a piezoelectric element; and
the controller is configured or programmed to control the vibration acceleration by controlling a value of a voltage applied to the piezoelectric element to be larger than about 15 Vp-p and equal to or less than about 40 Vp-p.

8. The cleaning device according to claim 1, wherein
the controller is configured or programmed to:
control the driver to vibrate the translucent body both at a first vibration acceleration of larger than about $8.0 \times 10^5$ m/s$^2$ and equal to or less than about $21.0 \times 10^5$ m/s$^2$ and at a second vibration acceleration greater than the first vibration acceleration; and
vibrate the translucent body at the second vibration acceleration after vibrating the translucent body discharged with the cleaning liquid at the first vibration acceleration for a predetermined period of time.

9. The cleaning device according to claim 1, further comprising:
at least one second vibrator located around the translucent body; wherein
the driver drives the at least one second vibrator.

10. The cleaning device according to claim 9, wherein the controller is configured or programmed to vibrate the cleaning liquid on the surface of the translucent body by the at least one second vibrator after vibrating the translucent body discharged with the cleaning liquid by the first vibrator for a predetermined period of time.

11. The cleaning device according to claim 8, wherein the predetermined period of time is equal to or longer than about 5 seconds.

12. The cleaning device according to claim 1, wherein the controller is configured or programmed to adjust a concentration of the abrasive added to the cleaning liquid to be discharged onto the surface of the translucent body.

13. The cleaning device according to claim 12, wherein
the controller is configured or programmed to:
control the driver such that the translucent body is vibrated at a vibration acceleration larger than about $21.0 \times 10^5$ m/s$^2$;
atomize the liquid of the cleaning liquid discharged onto the surface of the translucent body; and
adjust the concentration of the abrasive added to the cleaning liquid.

14. The cleaning device according to claim 1, wherein the discharger is configured to switch between discharging the cleaning liquid including the abrasive and discharging the cleaning liquid including no abrasive, onto the surface of the translucent body.

15. The cleaning device according to claim 14, wherein the controller is configured or programmed to cause the discharger to discharge the cleaning liquid including no abrasive onto the surface of the translucent body after cleaning the surface of the translucent body with the cleaning liquid including the abrasive.

16. An imaging unit comprising:
the imaging device; and
the cleaning device according to claim 1.

17. The imaging unit according to claim 16, wherein a Mohs hardness of the abrasive is equal to or less than a Mohs hardness of the translucent body.

18. The imaging unit according to claim 16, wherein a density of the abrasive is equal to or larger than a density of a solvent of the cleaning liquid.

19. The imaging unit according to claim 16, wherein a concentration of the abrasive is less than about 50%.

* * * * *